(12) United States Patent
Simon

(10) Patent No.: US 6,894,273 B2
(45) Date of Patent: May 17, 2005

(54) SYSTEMS AND METHODS FOR PRODUCING MODULATED LIGHT BEAMS

(75) Inventor: Jonathan Simon, Castro Valley, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 249 days.

(21) Appl. No.: 10/103,925

(22) Filed: Mar. 22, 2002

(65) Prior Publication Data
US 2003/0178553 A1 Sep. 25, 2003

(51) Int. Cl.[7] .................................................. H01J 5/02
(52) U.S. Cl. ..................... 250/239; 250/214.1; 250/216
(58) Field of Search .......................... 250/214.1, 214 R, 250/216, 239, 551; 257/80–84, 431–435

(56) References Cited

U.S. PATENT DOCUMENTS 4,195,226 A * 3/1980 Robbins et al. ........ 250/363.01
4,274,028 A * 6/1981 Frame ........................ 313/530
5,939,773 A * 8/1999 Jiang et al. .................. 257/666

OTHER PUBLICATIONS

"Producing Modulated Light Using Electron Emitters," Ser. No.: 10,104,099, filed Mar. 22, 2002.

* cited by examiner

Primary Examiner—Que T. Le

(57) ABSTRACT

Optical systems for producing modulated light beams are provided. A representative optical system incorporates an integrated package that includes an optical source and an electro-optic modulator. The optical source is operative to produce light that is received by the electro-optic modulator. The electro-optic modulator externally modulates the light so that a modulated light beam is emitted from the integrated package. Methods and other optical systems also are provided.

28 Claims, 7 Drawing Sheets

SYSTEMS AND METHODS FOR PRODUCING MODULATED LIGHT BEAMS

FIELD OF THE INVENTION

The present invention generally relates to optics. More specifically, the invention relates to systems and methods for producing modulated light beams using integrated packages.

DESCRIPTION OF THE RELATED ART

Optical systems, such as optical communication systems, are configured to propagate signals between various locations. Through at least a portion of such a communication system, the signals are provided as light beams that are propagated along an optical path. Such an optical path usually is defined by one or more communication links, each of which typically includes an optical fiber.

Modulated light sources typically are used to generate light beams for propagating through communication links. More specifically, a modulated laser typically is associated with each communication link for generating the light beams. In this regard, directly modulated lasers typically have been used to generate these light beams.

Directly modulated lasers, however, have inherent limitations. In particular, these lasers typically are not capable of modulating at rates as fast as those exhibited by externally modulated lasers. As is known, directly modulated lasers typically are incapable of achieving modulation rates in excess of 10 Gbps.

Externally modulated lasers, although potentially capable of exhibiting higher rates of modulation than directly modulated lasers, can be difficult to manufacture. In particular, an externally modulated laser typically is constructed by forming multiple separate components, each of which may use a different manufacturing technique. Typically, the various components then are operatively aligned at the location where the externally modulated laser is to be used. As should be apparent, this procedure can be time-consuming and relatively inefficient.

Based on the foregoing, it should be appreciated that there is a need for improved systems and methods that address these and/or other shortcomings of the prior art.

SUMMARY OF THE INVENTION

The present invention involves the use of integrated packages for producing modulated light beams. In particular, optical systems of the invention include integrated packages that incorporate externally modulated optical sources. The externally modulated optical sources, e.g., lasers, of these integrated packages can potentially alleviate some of the perceived shortcomings associated with directly modulated lasers. In particular, externally modulated the optical sources of the integrated packages may be capable of providing faster modulation rates than those achievable by directly modulated lasers. Therefore, the integrated packages may be readily adapted for use in optical communication systems, for example.

By using integrated packages, improved efficiencies in manufacturing also may be achieved. More specifically, the integrated packages may be well suited for manufacture by batch-processing techniques. For instance, in some embodiments, the optical source is provided on a first substrate, e.g., a substrate formed of a material(s) suited for semiconductor fabrication, and the external modulator is formed on a second substrate. The first and second substrates then can be attached to each other, such as by a bonding operation.

By providing an integrated package for producing modulated light, difficulties associated with operatively aligning optical components at the location where the modulated light is required can be avoided. In particular, since the constituent components of the integrated package are operatively aligned with each other in a manufacturing environment, more precise alignment of the components can be achieved.

In some embodiments, the optical source(s) and modulator(s) can be arranged within an interior cavity formed by the integrated package. Advantageously, the integrated package provides a protective enclosure for the components arranged within the cavity, thereby improving system robustness. Additionally, the cavity can be hermetically sealed to reduce the potential for degradation of device performance due to contamination, for example.

An embodiment of an optical system of the invention incorporates an integrated package that includes an optical source and an electro-optic modulator. The optical source produces light that is received by the electro-optic modulator. The electro-optic modulator modulates the light so that a modulated light beam is emitted from the integrated package. In some embodiments, the electro-optic modulator includes a thin film electro-optic element formed of $LiNbO_3$, for example.

In some applications, the tendency of the frequency of an optical source, e.g., a laser, to drift with temperature may be problematic. In this regard, some embodiments of the invention use phosphorescent materials to generate light. Phosphorescent materials do not tend to suffer from variations in temperature. In particular, phosphorescent materials rely on atomic transitions to produce light and, therefore, inherently are relatively wavelength stable with respect to temperature.

In embodiments incorporating phosphorescent materials for producing light, electron emitters of an integrated package are used to stimulate the phosphorescent materials for generating the light. Advantageously, the light generated by the phosphorescent materials is relatively omnidirectional and, therefore, may not require the use of precision alignment techniques when optical components are to be aligned for receiving the light.

A representative optical system of the invention that uses phosphorescent materials for generating light incorporates an integrated package. The integrated package includes an electron emitter, an electrical-to-optical converter and an electro-optic modulator. The electron emitter produces a beam of electrons. The electrical-to-optical converter, which includes phosphorescent material, receives the beam of electrons and converts the beam of electrons into light. The electro-optic modulator receives the light and modulates the light so that a modulated light beam is emitted from the integrated package.

Optical systems of the invention also can include one or more arrays, each of which cam include multiple optical sources and associated electro-optic modulators. In this manner, one integrated package may be capable of emitting multiple modulated light beams. In some of these embodiments, the frequencies of the modulated light beams may be diverse.

An embodiment of a method of the invention for producing a modulated light beam includes: providing an integrated package; producing light within the integrated package; and, externally modulating the light such that a modulated light beam is emitted from the integrated package.

Another representative method for producing a modulated light beam includes: providing an integrated package; producing a beam of electrons within the integrated package; converting the beam of electrons into light within the integrated package; and externally modulating the light such that a modulated light beam is emitted from the integrated package.

Clearly, some embodiments of the invention may not exhibit one or more of the advantages and/or properties set forth above. Additionally, other systems, methods, features and/or advantages of the present invention will be or may become apparent to one with skill in the art upon examination of the following drawings and detailed description. It is intended that all such additional systems, methods, features and/or advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

As will be described in greater detail herein, optical systems of the invention include integrated packages that incorporate optical sources for producing modulated light beams. In particular, the optical sources are externally modulated and, therefore, are capable of exhibiting modulation rates that exceed those typically exhibited by directly modulated optical sources. Additionally, by providing the optical sources within the integrated packages, alignment of the various components for producing the modulated light beams can be accomplished in a manufacturing environment. Therefore, alignment of the components can be performed more efficiently and effectively than optical components that are aligned at the location of use.

Figure 1:
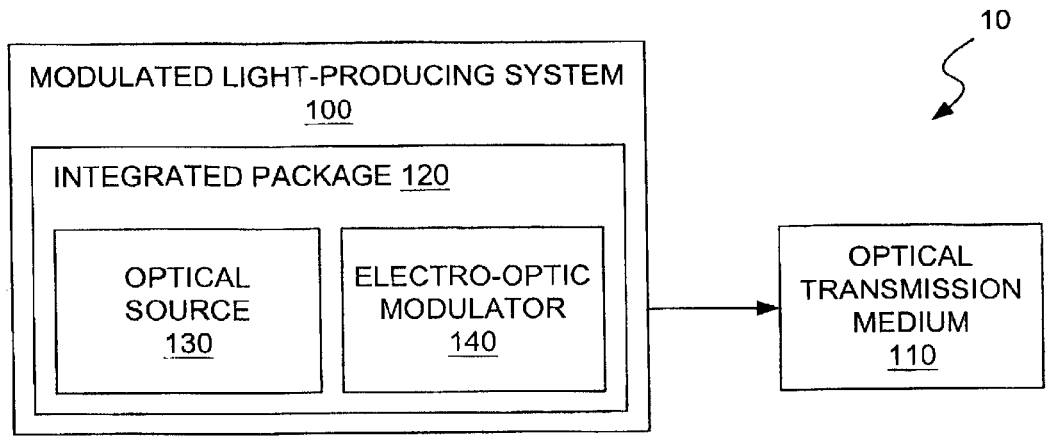
FIG. 1 is a schematic diagram of an embodiment of an optical system of the present invention.

Referring now to the figures, wherein like reference numerals indicate corresponding components throughout the several views, FIG. 1 schematically depicts an embodiment of an optical system 10 of the present invention. As shown in FIG. 1, optical system 10 includes a modulated light-producing system 100 that optically communicates with an optical transmission medium 110. Modulated light-producing system 100 generates a modulated light beam that can be provided to and then propagated by optical transmission medium 110. Optical transmission medium 110 can be an optical fiber or free space, for example. As used here, the term "modulate" refers to altering at least one characteristic of light. Thus, with respect to light beams, modulated light beams are light beams that are altered with respect to one or more of various characteristics, such as intensity (amplitude), polarization, and frequency.

Modulated light-producing system 100 of FIG. 1 incorporates at least one integrated package 120. As used here, the term "integrated package" refers to a device configuration that can be formed by a batch-processing technique and/or that provides a degree of robustness and/or resistance to external environments that is not exhibited individually by the constituent components of the device.

Each of the integrated packages 120 of optical system 10 includes at least one optical source 130 and at least one electro-optic modulator 140. Each optical source 130 produces a light beam. Each electro-optic modulator 140 interacts with a corresponding light beam emitted from an optical source to produce a modulated light beam. Thus, embodiments of the modulated light-producing system 100 use externally modulated optical sources to produce modulated light beams. This, however, should not be construed to exclude the additional use of direct modulation in some embodiments.

Figure 2:
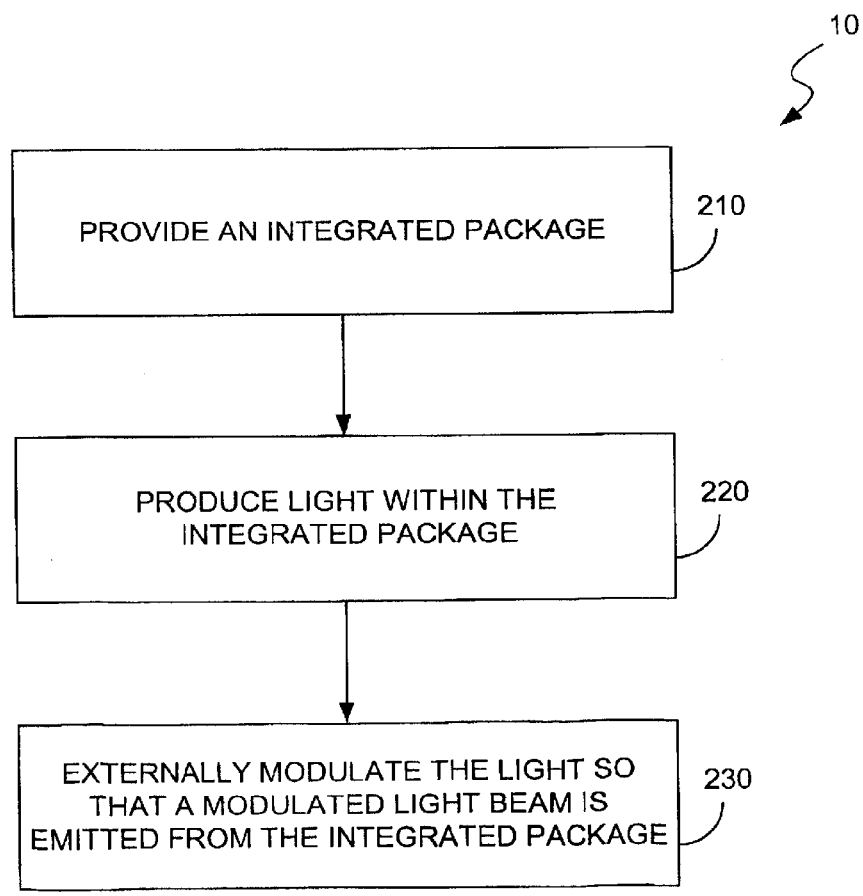
FIG. 2 is a flowchart depicting a first functionality associated with the modulated light-producing system of FIG. 1.

Functionality of an embodiment of a modulated light-producing system 100 of FIG. 1 is depicted in the flowchart of FIG. 2. As shown in FIG. 2, an integrated package is provided in block 210. In block 220, light is produced within the integrated package. Thereafter, such as depicted in block 230, the light is externally modulated so that a modulated light beam is emitted from the integrated package. As mentioned before, an electro-optic modulator is used to modulate the light externally.

Figure 3:
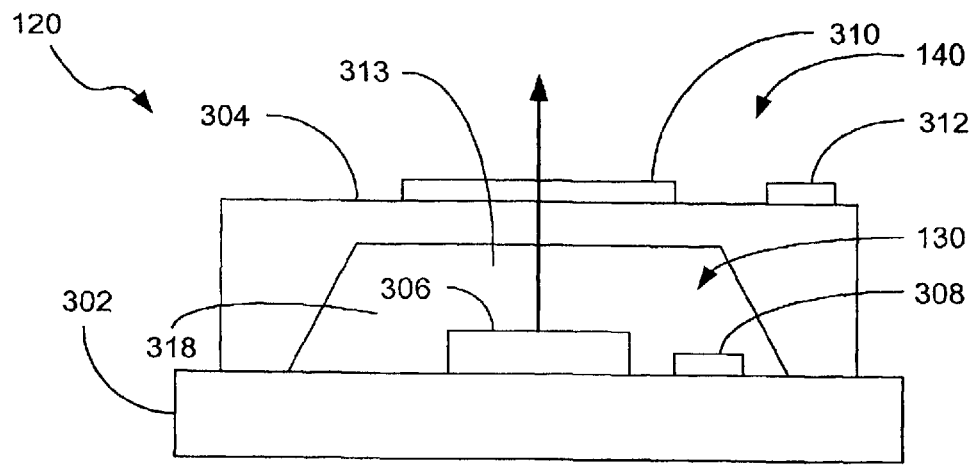
FIG. 3 is a schematic diagram of an embodiment of an integrated package that can be used in the modulated light-producing system of FIG. 1.

Referring to the schematic diagram of FIG. 3, an embodiment of an integrated package 120 that can be used in a modulated light-producing system of the invention will be described in greater detail. In FIG. 3, integrated package 120 includes a first substrate 302 and a second substrate 304. The first and second substrates are fixed in position relative to each other, such as by bonding the substrates together, to form the integrated package.

At least one of substrate 302 and 304 supports an optical source 130. Optical source 130 includes a laser 306, e.g., a vertical-cavity surface-emitting laser (VCSEL), and associated driving circuitry 308. The driving circuitry 308 receives power and/or control signals for the laser, at least some of which may originate outside the integrated package. Substrate 302 can be formed of a material(s), e.g., silicon, that is suitable for use in a semiconductor fabrication process. In this manner, driving circuitry 308 can be formed, such as by a semiconductor fabrication process, in and/or on substrate 302.

At least one of substrate 302 and 304 supports an electro-optic modulator 140. The electro-optic modulator 140 externally modulates light beams emitted from laser 306. The electro-optic modulator 140 includes an electro-optic element 310 and associated driving circuitry 312. Driving circuitry 312 receives power, information, and/or control signals for the electro-optic element, at least some of which may originate outside the integrated package.

Arranging the driving circuitry 312 in close proximity to, e.g., on the same substrate as, electro-optic element 310 potentially enables higher rates of modulation of light received by the electro-optic element. This is because the reduced signal transmission path length between the driving circuitry and the electro-optic element enables the use of high-capacity transmission media for providing control inputs from the driving circuitry to the electro-optic element.

The electro-optic element is arranged to communicate optically with laser 306. In the embodiment of FIG. 3, which includes substrate 304 being arranged between substrate 302 and the electro-optic modulator, substrate 304 permits a light beam emitted from the laser to be directed to the electro-optic element. By way of example, substrate 304 could include an aperture (not shown) that is aligned between the laser and the electro-optic element. In other embodiments, at least a portion of substrate 304, i.e., at least the portion of substrate 304 arranged between the laser and the electro-optic element, can be formed of a material that is optically transparent at the wavelength of the light transmitted by the optical source.

The electro-optic element can be provided in various forms and can be formed of various materials and/or combinations of materials. For instance, the electro-optic element can be a thin film element compatible with semiconductor fabrication. In such an embodiment, the electro-optic element can be formed with the substrate that supports it. In some embodiments, the electro-optic element can be formed of $LiNO_3$, quartz, etc. Clearly, the material(s) can be selected based upon the requirements of the particular application.

By way of example, when the electro-optic element is formed of $LiNO_3$, the driving circuitry 312 of the electro-optic modulator enables an electric field to be generated in the electro-optic element. The electric field alters at least one characteristic, e.g., the index of refraction, of at least a portion of the electro-optic element through which the light beam propagates. It is this change of the electro-optic element that enables modulation of the light beams. In this case, the light beams are modulated with respect to amplitude (intensity).

By way of further example, some electro-optic elements can change the length of the optical path through which light propagates to produce frequency modulation. In some embodiments, the electro-optic element generates acoustic energy that is used to lengthen and/or shorten the optical path. Clearly, modulation of the light beams with respect to other optical characteristics can be accomplished by using other kinds of electro-optical modulators.

Note, in the FIG. 3, a gap 313 exists between the substrate 304 and the laser, i.e., the laser does not contact substrate 304. This gap can be sized and shaped to accommodate a manufacturing tolerance associated with forming the integrated package. In particular, the manufacturing tolerance is selected so that, during formation of the integrated package, the various components of the integrated package do not engage and/or damage each other. In some embodiments, however, the components may engage each other and, thus, a gap is not required.

In FIG. 3, gap 313 is defined, at least in part, by a recess 315 formed in substrate 304. By way of example, substrate 304 could be etched to form the recess.

Also note that laser 306 typically is a constant source, i.e., the laser constantly produces a light beam when in operation. In such embodiments, the laser is only externally modulated. Note, in some embodiments, the laser may additionally be directly modulated. That is, the laser can produce light beams intermittently.

Figure 4:
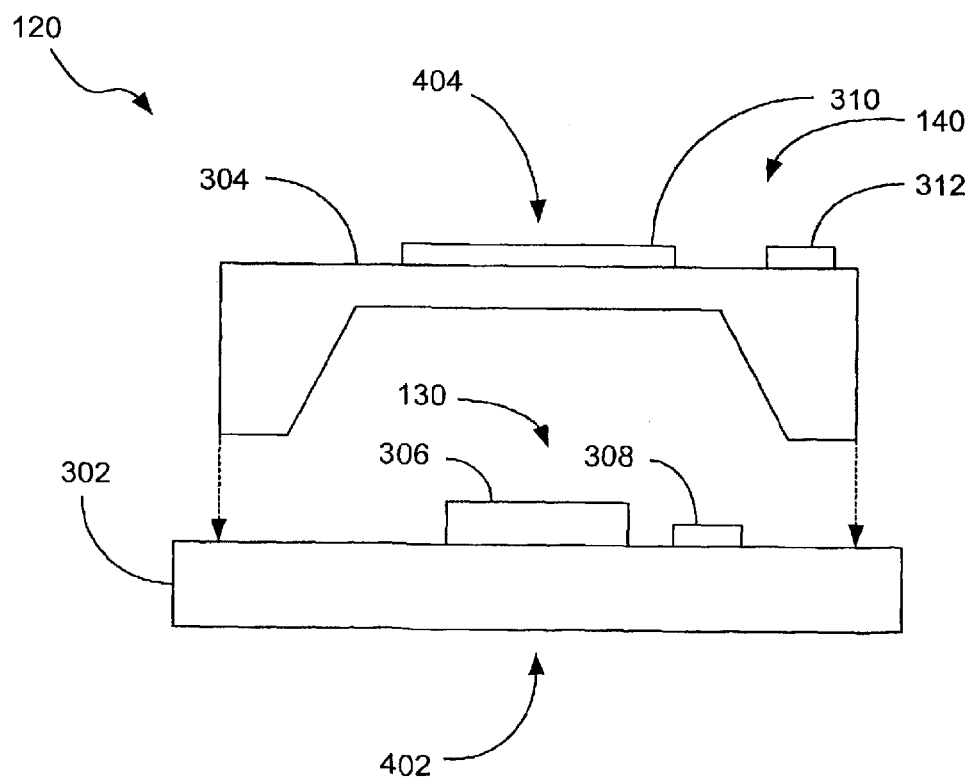
FIG. 4 is a schematic diagram of the integrated package of FIG. 3, showing assembly detail.

Integrated packages of the invention can be constructed by various fabrication techniques. For instance, as shown in FIG. 4, a representative integrated package 120 can be formed of multiple sections. In particular, a first section 402 of the integrated package includes substrate 302 and its associated optical source 130, and a second section 404 includes substrate 304 and its associated electro-optic modulator 140.

By using integrated packages, improved efficiencies in manufacturing may be achieved. More specifically, the integrated packages may be well suited for manufacture by batch-processing techniques. Additionally, in those embodiments that include first and second substrates that are separately formed, different manufacturing techniques can be used to form each of the substrates.

Alignment of the substrates and the various components of the integrated package can be conducted in a manufacturing environment. Therefore, more precise alignment of the components can be achieved. This is in contrast to other assemblies that are used for producing modulated light that require operatively aligning optical components at the location where the modulated light is required.

Figure 5:
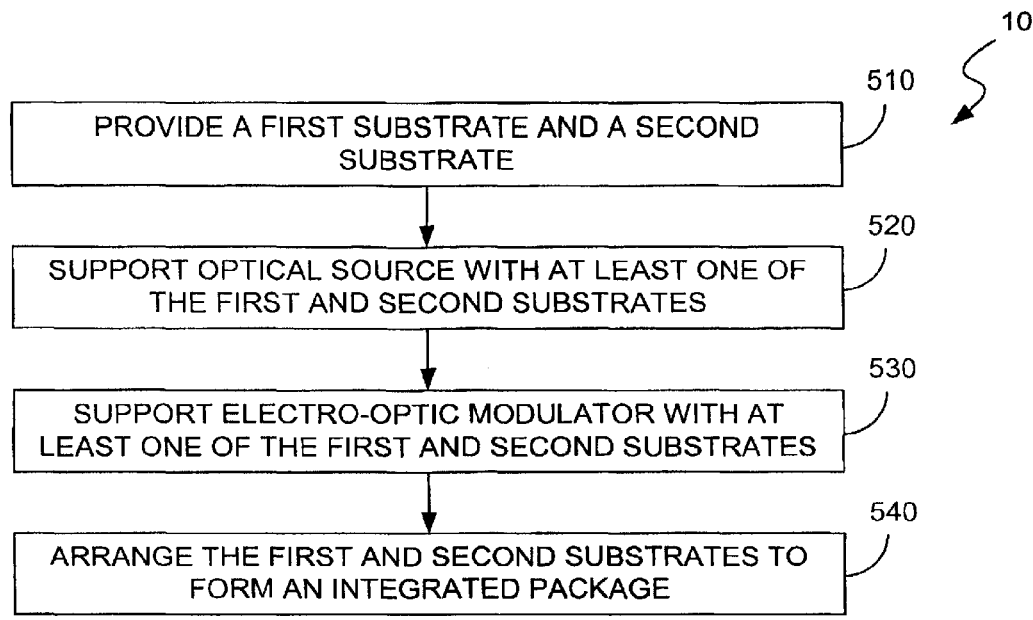
FIG. 5 is a flowchart depicting an embodiment of a method for forming an integrated package of the present invention.

An embodiment of a method for forming an integrated package of the invention is depicted in the flowchart of FIG. 5. In FIG. 5, a first substrate and a second substrate are provided (block 510). In block 520, an optical source, e.g., a VCSEL and associated driving circuitry, is supported by at least one of the first and second substrates. Proceeding to block 530, an electro-optic modulator, e.g., a thin film electro-optic element and associated driving circuitry, is supported by at least one of the first and second substrates. Thereafter, such as depicted in block 540, the first substrate and second substrate are arranged to form an integrated package. In some embodiments, this can include directly and fixedly attaching the substrates to each other. Attachment of the substrates also can form a hermetically sealed environment within the integrated package in some embodiments.

Note, although the embodiments of the invention discussed thus far use VCSELs, other optical sources can be used. For instance, VCSELs may not be deemed suitable for use in applications where a high degree of wavelength stability is required. This is because the wavelength of the light produced by a VCSEL tends to drift with temperature. Additionally, since VCSELs provide outputs that typically are narrowly collimated, alignment of VCSELs with other optical components can be difficult.

Figure 6:
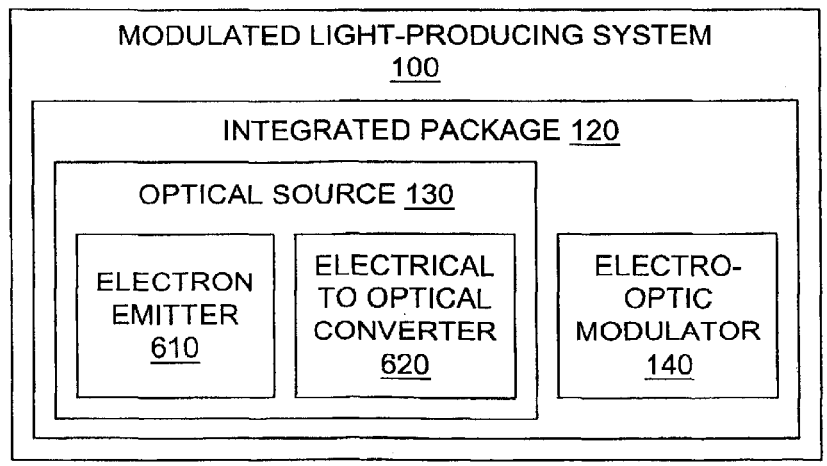
FIG. 6 is a schematic diagram of an embodiment of the modulated light-producing system of FIG. 1.

In order to address at least some of these difficulties, some embodiments of the modulated light-producing systems of the invention include the use of electron emitters for generating light. In particular, the electron emitters are used to stimulate phosphorescent materials. Advantageously, the light produced by the phosphorescent material(s) can be omnidirectional, so that precise alignment of the electro-optic modulator may not be required. Additionally, the wavelength of the light produced by phosphorescent material does not tend to vary with temperature, as is known to occur in other light-producing components, e.g., lasers. Specifically, phosphorescent materials rely on atomic transitions to produce light and, therefore, inherently are relatively wavelength stable with respect to temperature. This aspect may render at least some of the embodiments that use phosphorescent materials for producing light particularly well suited for short range, free space applications, where a change in the wavelength of the light produced can degrade system performance. FIG. 6 schematically depicts an embodiment that uses an electron emitter and phosphorescent material to produce light.

As shown in FIG. 6, modulated light-producing system 100 incorporates at least one integrated package 120, each of which includes at least one optical source 130 and at least one electro-optic modulator 140. Each optical source 130 includes at least one electron emitter 610 and an associated electrical-to-optical converter 620. The electron emitter, e.g., a sharpened tip emitter, solid-state emitter, cold-cathode emitter, etc., produces a beam of electrons that is directed toward the electrical-to-optical converter. The electrical-to-optical converter receives the beam of electrons and converts the beam of electrons into light. Each electro-optic modulator 140 interacts with the light emitted from an electrical-to-optical converter to produce a modulated light beam.

Figure 7:
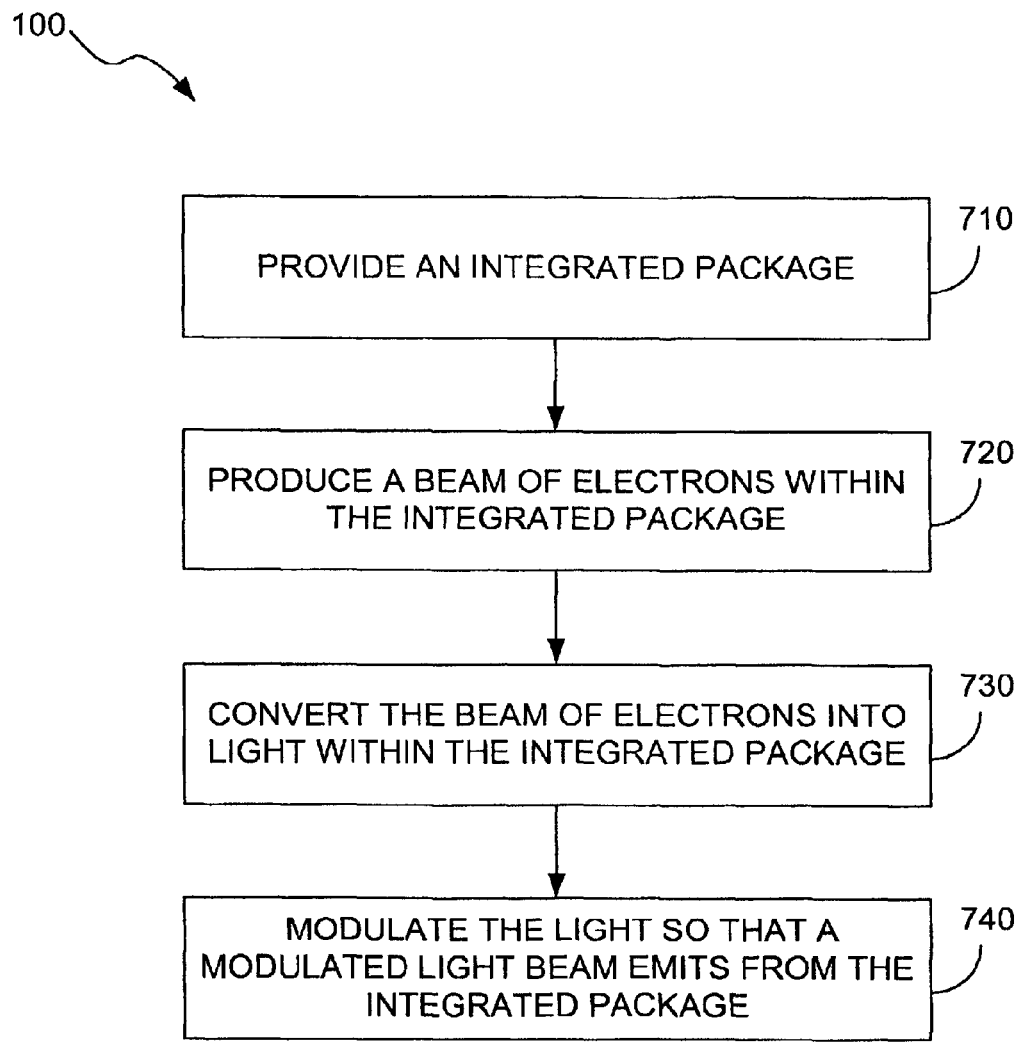
FIG. 7 is a flowchart depicting a functionality associated with the modulated light-producing system of FIG. 6.

Functionality of the embodiment of the modulated light-producing system 100 of FIG. 6 is depicted in FIG. 7. As shown in FIG. 7, an integrated package is provided in block 710. In block 720, a beam of electrons is produced and subsequently (in block 730) converted into light within the integrated package. Thereafter, such as depicted in block 740, the light is modulated so that a modulated light beam is emitted from the integrated package.

Figure 8:
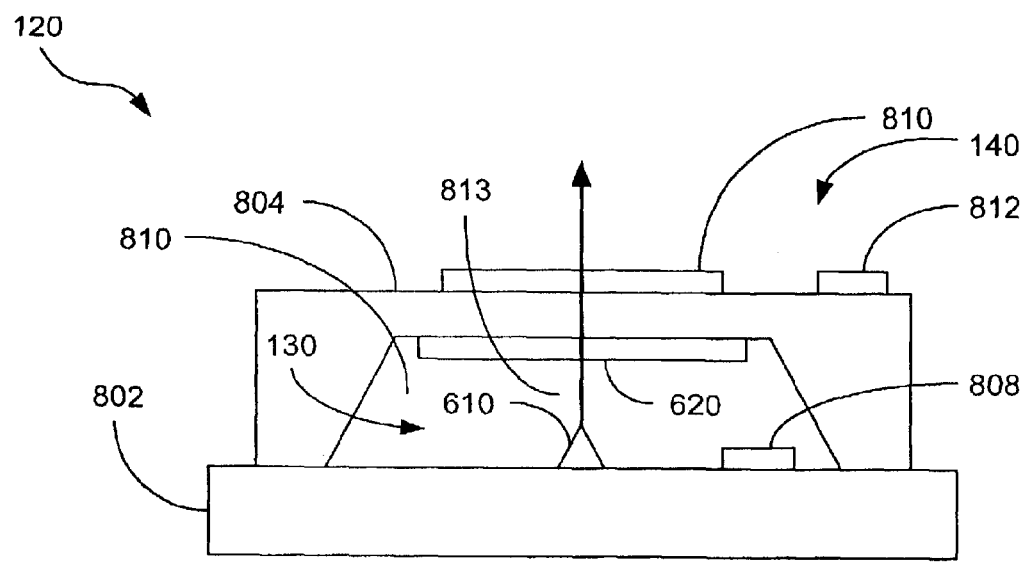
FIG. 8 is a schematic diagram of an embodiment of an integrated package that can be used in the modulated light-producing system of FIG. 6.

Reference is now made to the schematic diagram of FIG. 8, which depicts an embodiment of an integrated package that can be used in a modulated light-producing system, such as the modulated light-producing system 100 of FIG. 6. In FIG. 8, integrated package 120 includes a first substrate 802 and a second substrate 804. The first and second substrates are arranged in a fixed relationship with respect to each other, such as by bonding the substrates together, to form the integrated package.

Substrate 802 supports an electron emitter 610 and associated driving circuitry 808 of an optical source 130. The driving circuitry receives power and/or control signals for the electron emitter 610, at least some of which may originate outside the integrated package. Substrate 802 can be formed of a material(s), e.g., silicon, that is suitable for use in a semiconductor fabrication process. Thus, electron emitter 806 and driving circuitry 808 can be formed in and/or on substrate 802. Note, in some embodiments, other materials can be used to form the substrate provided that adequate mechanical support is provided for mounting the electron emitter.

Substrate 804 supports the electrical-to-optical converter 620 of the optical source 130 as well as electro-optic modulator 140. The electrical-to-optical converter converts electrical energy, e.g., a beam of electrons, into light energy. In some embodiments, the electrical-to-optical converter includes one or more phosphorescent materials, such as phosphor, that are configured as one or more layers, for example. The layers are arranged to receive electrons emitted from the electron emitter. Received electrons are converted to light that is provided to electro-optic modulator 140.

The electro-optic modulator 140 includes an electro-optic element 810 and associated driving circuitry 812. The electro-optic element 810 communicates optically with electrical-to-optical converter 620. More specifically, the electro-optic element 810 is arranged so that light produced by the electrical-to-optical converter can be received by the electro-optic modulator. Thus, in the embodiment of FIG. 8, which includes substrate 804 being arranged between electrical-to-optical converter 620 and the electro-optic modulator 140, substrate 804 permits light emitted from the electrical-to-optical converter 620 to be directed to the electro-optic element 810. By way of example, substrate 804 could include an aperture (not shown) that is aligned between the electrical-to-optical converter 620 and the electro-optic element 810. In other embodiments, at least a portion of substrate 804, i.e., at least the portion of substrate 804 arranged between the electrical-to-optical converter and the electro-optic element, can be formed of a material that is optically transparent at the wavelength of the light transmitted by the optical source.

As shown in FIG. 8, electron emitter 610 is arranged within a cavity 810 that is formed between substrates 802 and 804. Based upon the power and/or performance characteristics of the electron emitter, it may be necessary to maintain the cavity under vacuum pressure so the beam of electrons emitted can be properly directed to the electrical-to-optical converter.

Note, in FIG. 8, a gap 813 is formed between the substrate 804 and the electron emitter 610. This gap can be sized and shaped to accommodate a manufacturing tolerance associated with forming the integrated package. In particular, the manufacturing tolerance is selected so that, during formation of the integrated package, the various components of the integrated package do not engage and/or damage each other, e.g., the electron emitter 610 does not contact the electrical-to-optical converter 620. Also note, in some embodiments, the electro-optic modulator could be arranged within the gap, i.e., between the electrical-to-optical converter 620 and substrate 804.

Figure 9:
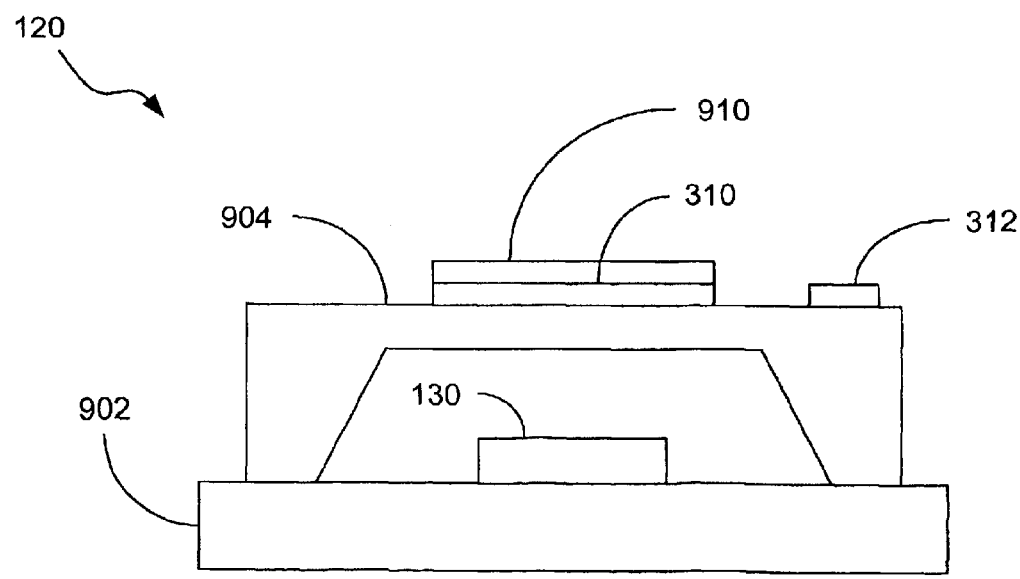
FIG. 9 is a schematic diagram of another embodiment of an integrated package that can be used in the modulated light-producing system of FIG. 1.

In some applications, it is desirable to focus light emitted by a modulated light-producing system. An embodiment of an integrated package that can be used in a modulated light-producing system for emitting focused light is depicted in FIG. 9. In FIG. 9, integrated package 900 includes a first substrate 902, which supports optical source 130, and a second substrate 904, which includes an electro-optic element 310 and associated driving circuitry 312. Note, optical source 130 can include a laser and/or an electron emitter and electrical-to-optical converter, and associated drive circuitry.

Integrated package 120 also includes a focusing element 910 that optically communicates with the electro-optic element. The focusing element is arranged so that the electro-optic element 310 is at least partially disposed between the optical source 130 and the focusing element 910. In the embodiment of FIG. 9, focusing element 910 is formed directly onto the electro-optic element; however, various other configurations can be used.

Regardless of the particular configuration used, the focusing element directs, focuses and/or, otherwise, spatially modifies received light. For example, the focusing element can be used to focus a modulated light beam so that it can be efficiently propagated to an optical transmission medium, e.g., medium 110 of FIG. 1. Note, the focusing element may include diffractive and/or refractive material(s), for example.

Figure 10:
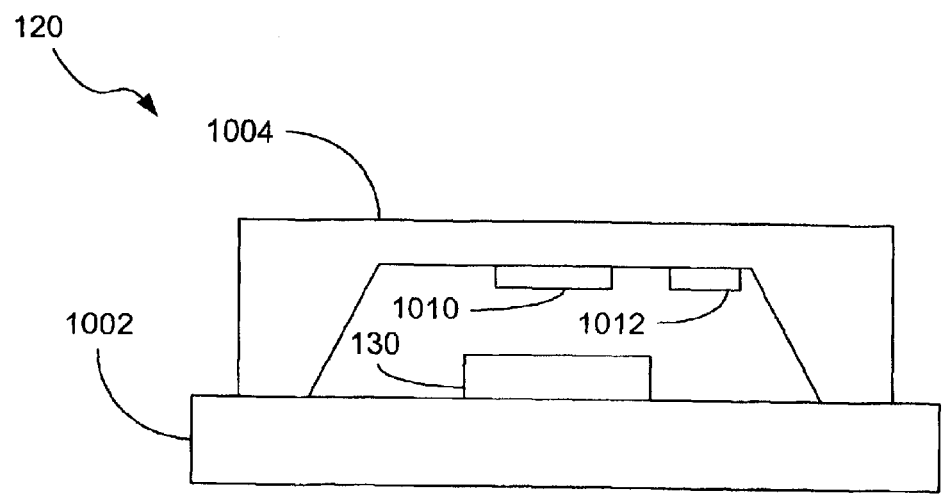
FIG. 10 is a schematic diagram of another embodiment of an integrated package that can be used in the modulated light-producing system of FIG. 1.

Another embodiment of an integrated package that can be used in a modulated light-producing system is depicted in FIG. 10. In FIG. 10, integrated package 120 includes a first substrate 1002, which supports optical source 130, and a second substrate 1004, which includes an electro-optic element 1010 and associated driving circuitry 1012. Note, that in the embodiment of FIG. 10, the substrates 1002 and 1004 form a enclosure that encases the optical source, electro-optic element and drive circuitry.

By forming an enclosure, a robust modulated light source can be produced. More specifically, the enclosure can protect one or more of the components from damage, such as may occur during component handling. Additionally, when the integrated package forms a hermetic seal about at least some of the components, the potential for degradation of device performance due to contamination of those components, for example, can be reduced.

Figure 11:
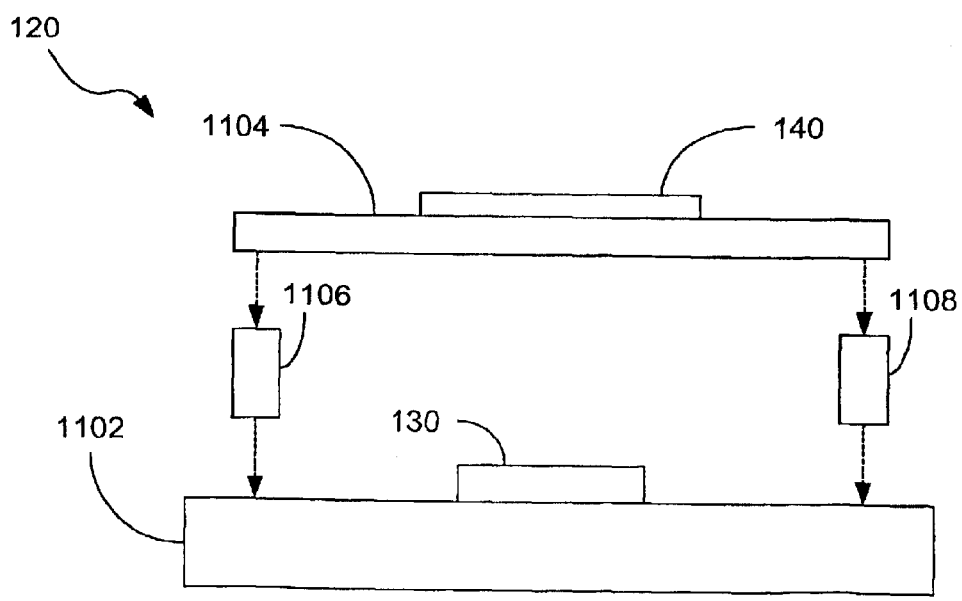
FIG. 11 is a schematic diagram of still another embodiment of an integrated package that can be used in the modulated light-producing system of FIG. 1.

As shown in FIG. 11, techniques can be used for fabricating an integrated package other than those depicted schematically in the previous figures. In particular, the exemplary technique depicted in FIG. 11 includes providing two substrates (1102, 1104) that are substantially planar. The various components, e.g., optical source 130 and electro-optic modulator 310, can be formed on and/or in the substrates and then the substrates can be arranged in a substantially fixed spatial relationship relative to each other. In the embodiment depicted in FIG. 11, this is accomplished by arranging mounting components (1106, 1108) between the substrates. In this manner, mounting components maintain the substrates in a spaced relationship from each other. Clearly, the size of the mounting components influences the substrate spacing.

Integrated packages of the invention also are capable of being configured as high-density arrays that are capable of producing multiple modulated light beams. For instance, the low threshold currents typically associated with VCSELs may render VCSELs particularly well suited for such an application. In this regard, a representative embodiment of an integrated package that incorporates an array of VCSELs is depicted in FIG. 12.

Figure 12:
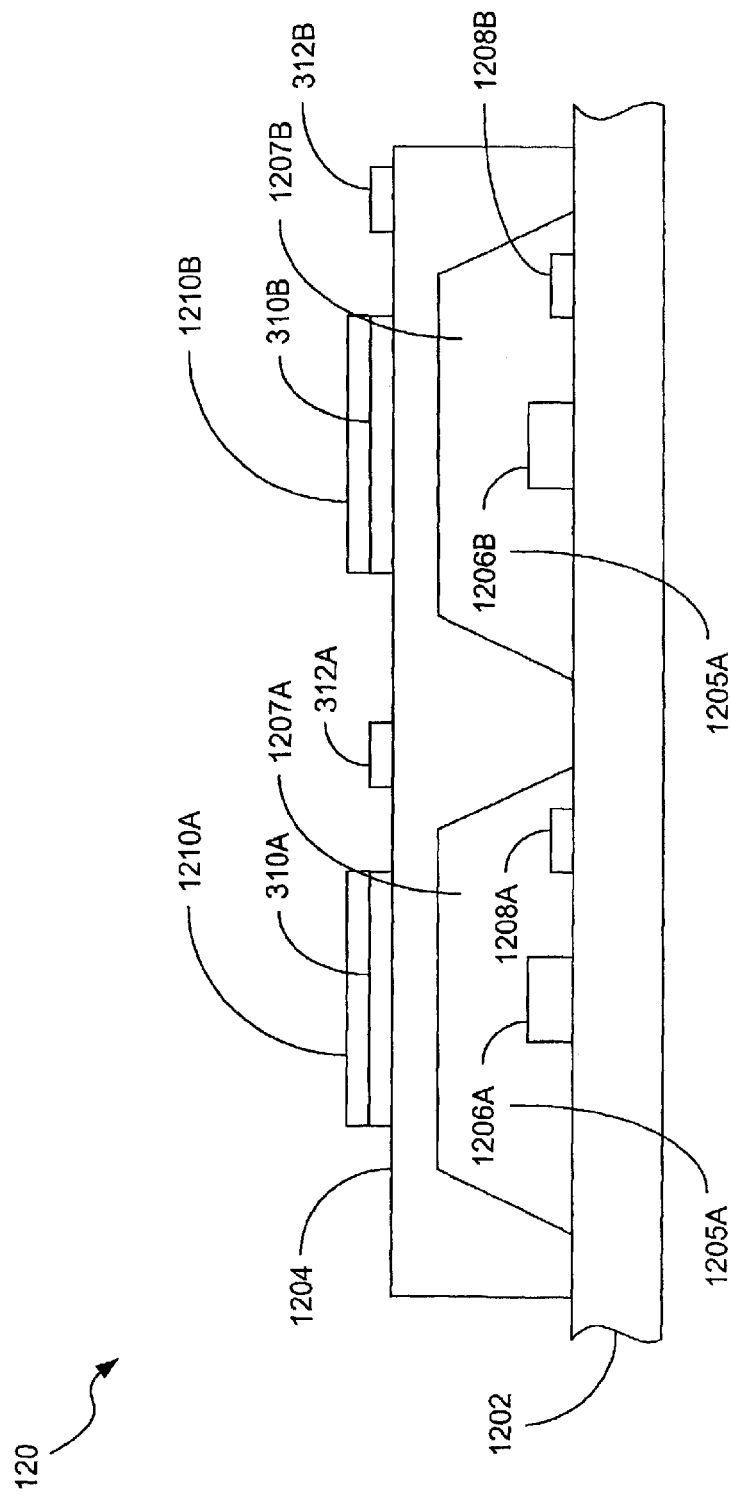
FIG. 12 is a schematic diagram of yet another embodiment of an integrated package that can be used in the modulated light-producing system of FIG. 1.

Integrated package 120 of FIG. 12 includes a lower substrate 1202 that supports multiple VCSELs (1206A, 1206B) and associated driving circuitry (1208A, 1208B). Substrate 1202 engages an upper substrate 1204 that defines multiple recesses (1205A, 1205B). Each of the recesses defines a cavity (1207A, 1207B) within which an electro-optic element (310A, 310B) and associated driving circuitry (312A, 312B) are arranged. Substrate 1204 also supports focusing elements (1210A, 1210B) that engage respective electro-optic elements (310A, 310B). By arranging only one optical source in each cavity, crosstalk between adjacent optical sources can be avoided. However, in those embodiments in which crosstalk is not problematic, multiple optical sources could be arranged within a single cavity.

Additionally, in other embodiments, multiple upper substrates could be used to define cavities for housing the VCSELs. For example, each upper substrate could define one recess that defines a cavity for receiving a VCSEL.

Each VCSEL of an integrated package 120 need not exhibit the same optical properties, e.g., wavelength, as another. Therefore, the array of VCSELs of such an integrated package may be used in a Wavelength Division Multiplexing (WDM) application. In such an application, multiple individual light signals are modulated with respect to a carrier wavelength, propagated along the same optical transmission medium, and then deconvolved at a receiving end.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated.

By way of example, it should also be noted that the functions noted in various blocks of FIG. 5, or in any other of the flowcharts, may occur out of the order in which they are depicted. For example, two blocks shown in succession in FIG. 5 may, in fact, be executed substantially concurrently. In other embodiments, the blocks may sometimes be executed in the reverse order depending upon the functionality involved. Additionally, the array-configured integrated package of FIG. 12 is described as using VCSELs as the optical source. Clearly, other types of optical sources, such as other types of lasers and electron emitter/phosphor assemblies can be used in other embodiments. All such modifications and variations are within the scope of the invention as determined by the appended claims when interpreted in accordance with the breadth to which they are fairly and legally entitled.

What is claimed is:

1. An optical system comprising:
    an integrated package including an optical source and an electro-optic modulator, said optical source being operative to produce light, said electro-optic modulator being operative to receive the light and externally modulate the light such that a modulated light beam is emitted from said integrated package.

2. The optical system of claim 1, wherein said integrated package includes a substrate; and
    wherein said optical source is a vertical-cavity surface-emitting laser supported by said substrate.

3. The optical system of claim 1, wherein said optical source comprises an electron emitter and an electrical-to-optical converter, the electron emitter being operative to emit a beam of electrons, the electrical-to-optical converter being operative to receive the beam of electrons and convert the electrons into light.

4. The optical system of claim 3, wherein the electrical-to-optical converter comprises phosphorescent material.

5. The optical system of claim 1, further comprising:
    a focusing element optically communicating with said electro-optic modulator, said focusing element being operative to receive a modulated light beam from said electro-optic modulator and spatially modify the modulated light beam.

6. The optical system of claim 1, wherein said integrated package includes a first substrate supporting said optical source and a second substrate supporting said electro-optic modulator.

7. The optical system of claim 6, wherein the electro-optic modulator includes an electro-optic element and driving circuitry, and said driving circuitry is formed in said second substrate.

8. The optical system of claim 1, wherein said electro-optic modulator includes an electro-optic element and driving circuitry, and said electro-optic element is a thin film electro-optic element.

9. The optical system of claim 1, wherein said electro-optic modulator amplitude modulates the light.

10. The optical system of claim 1, wherein said electro-optic modulator frequency modulates the light.

11. The optical system of claim 1, further comprising:
    an optical transmission medium optically communicating with said integrated package.

12. The optical system of claim 1, wherein said optical source is a first optical source and said electro-optic modulator is a first electro-optic modulator; and wherein said integrated package further includes a second optical source and a second electro-optic modulator, said second optical source being operative to produce light, said second electro-optic modulator being operative to receive the light from said second optical source and externally modulate the light such that a second modulated light beam is emitted from said integrated package.

13. The optical system of claim 12, wherein said integrated package includes a substrate; and wherein said first optical source and said second optical source are supported by said substrate.

14. The optical system of claim 12, wherein said integrated package includes a first substrate and a second substrate, said first substrate and said second substrate engaging each other to form a first cavity therebetween, said first optical source being arranged in said first cavity.

15. The optical system of claim 14, wherein said first substrate and said second substrate form a second cavity, said second optical source being arranged in said second cavity.

16. The optical system of claim 14, wherein said integrated package includes a third substrate, said first substrate and said third substrate engaging each other to form a second cavity, said second optical source being arranged in said second cavity.

17. The optical system of claim 14, wherein said first cavity is hermetically sealed.

18. The optical system of claim 14, wherein said first cavity is maintained under vacuum pressure.

19. The optical system of claim 1, wherein said integrated package includes a first substrate and a second substrate, said optical source being supported by said first substrate, said electro-optic modulator being supported by said second substrate.

20. The optical system of claim 19, wherein said first substrate and said second substrate are attached directly to each other.

21. A method for producing a modulated light beam comprising:

providing an integrated package;

producing light within the integrated package; and externally modulating the light such that a modulated light beam is emitted from the integrated package.

22. The method of claim 21, wherein the integrated package includes a vertical-cavity surface-emitting laser; and wherein producing light comprises:

producing light with the vertical-cavity surface-emitting laser.

23. The method of claim 21, wherein producing light comprises:

producing a beam of electrons; and converting the beam of electrons into light.

24. The method of claim 21, further comprising:

providing an electro-optic modulator; and wherein externally modulating the light comprises:

altering a characteristic of the electro-optic modulator.

25. The method of claim 21, further comprising:

focusing the light beam.

26. The method of claim 21, further comprising:

providing an optical transmission medium; and propagating the modulated light beam to the optical transmission medium.

27. The method of claim 21, wherein the modulated light beam is a first modulated light beam; and further comprising:

producing second light within the integrated package; and externally modulating the second light such that a second modulated light beam is emitted from the integrated package.

28. The method of claim 27, wherein the first modulated light beam exhibits a different frequency than the second modulated light beam.

* * * * *